United States Patent
Choi et al.

(10) Patent No.: US 12,362,730 B2
(45) Date of Patent: Jul. 15, 2025

(54) SPDT SWITCHES WITH EMBEDDED ATTENUATORS

(71) Applicant: Qorvo US, Inc., Greensboro, NC (US)

(72) Inventors: Jinsung Choi, Greensboro, NC (US); Marcus Granger-Jones, Scotts Valley, CA (US); Jeffery Peter Ortiz, Chandler, AZ (US)

(73) Assignee: Qorvo US, Inc., Greensboro, NC (US)

( * ) Notice: Subject to any disclaimer, the term of this patent is extended or adjusted under 35 U.S.C. 154(b) by 13 days.

(21) Appl. No.: 17/990,428

(22) Filed: Nov. 18, 2022

(65) Prior Publication Data

US 2023/0163751 A1    May 25, 2023

Related U.S. Application Data

(60) Provisional application No. 63/282,973, filed on Nov. 24, 2021.

(51) Int. Cl.
  *H03H 11/24*  (2006.01)
  *H03K 17/687* (2006.01)

(52) U.S. Cl.
  CPC ....... *H03H 11/245* (2013.01); *H03K 17/6871* (2013.01)

(58) Field of Classification Search
  CPC ................. H03H 11/245; H03K 17/6871
  See application file for complete search history.

(56) References Cited

U.S. PATENT DOCUMENTS

| 10,666,313 | B2 * | 5/2020 | Tombak | H04B 1/48 |
| 10,790,804 | B2 * | 9/2020 | Bawell | H01P 1/22 |
| 2013/0072134 | A1 | 3/2013 | Goto et al. | |
| 2018/0131368 | A1 | 5/2018 | Lu et al. | |

FOREIGN PATENT DOCUMENTS

WO    2016150484 A1    9/2016

OTHER PUBLICATIONS

Extended European Search Report for European Patent Application No. 22209207.4, mailed Mar. 30, 2023, 8 pages.

* cited by examiner

*Primary Examiner* — Menatoallah Youssef
*Assistant Examiner* — Colleen J O Toole
(74) *Attorney, Agent, or Firm* — Withrow & Terranova, P.L.L.C.

(57) ABSTRACT

A single pole double throw (SPDT) switch with embedded attenuators includes a transmitter attenuator circuit directly connected to a common input of the SPDT switch, and a receiver attenuator circuit directly connected to the common input of the SPDT switch. Switches in the transmitter attenuator circuit and in the receiver attenuator circuit are selectively or individually set to an open state or to a closed state to directly connect the transmitter attenuator circuit or the receiver attenuator circuit to the common input. The selective setting of the states of the switches also determines a given amount of attenuation for the transmitter attenuator circuit or the receiver attenuator circuit.

19 Claims, 12 Drawing Sheets

| # | se | sh |
|---|---|---|
| SW_0 | 322 | 31.5 |
| SW_1 | 135 | 6.8 |
| SW_2 | 45 | 6.0 |
| SW_3 | 22.5 | 5.4 |
| SW_4 | 13.3 | 4.8 |
| SW_5 | 8.8 | 4.3 |
| SW_6 | 31.5 | 3.8 |

Switch width [um]

| # | se | sh |
|---|---|---|
| R_0 | 4.8 | 50 |
| R_1 | 11.5 | 230 |
| R_2 | 35 | 259 |
| R_3 | 70 | 290 |
| R_4 | 118 | 325 |
| R_5 | 178 | 365 |
| R_6 | 50 | 410 |

Resistance [ohm]

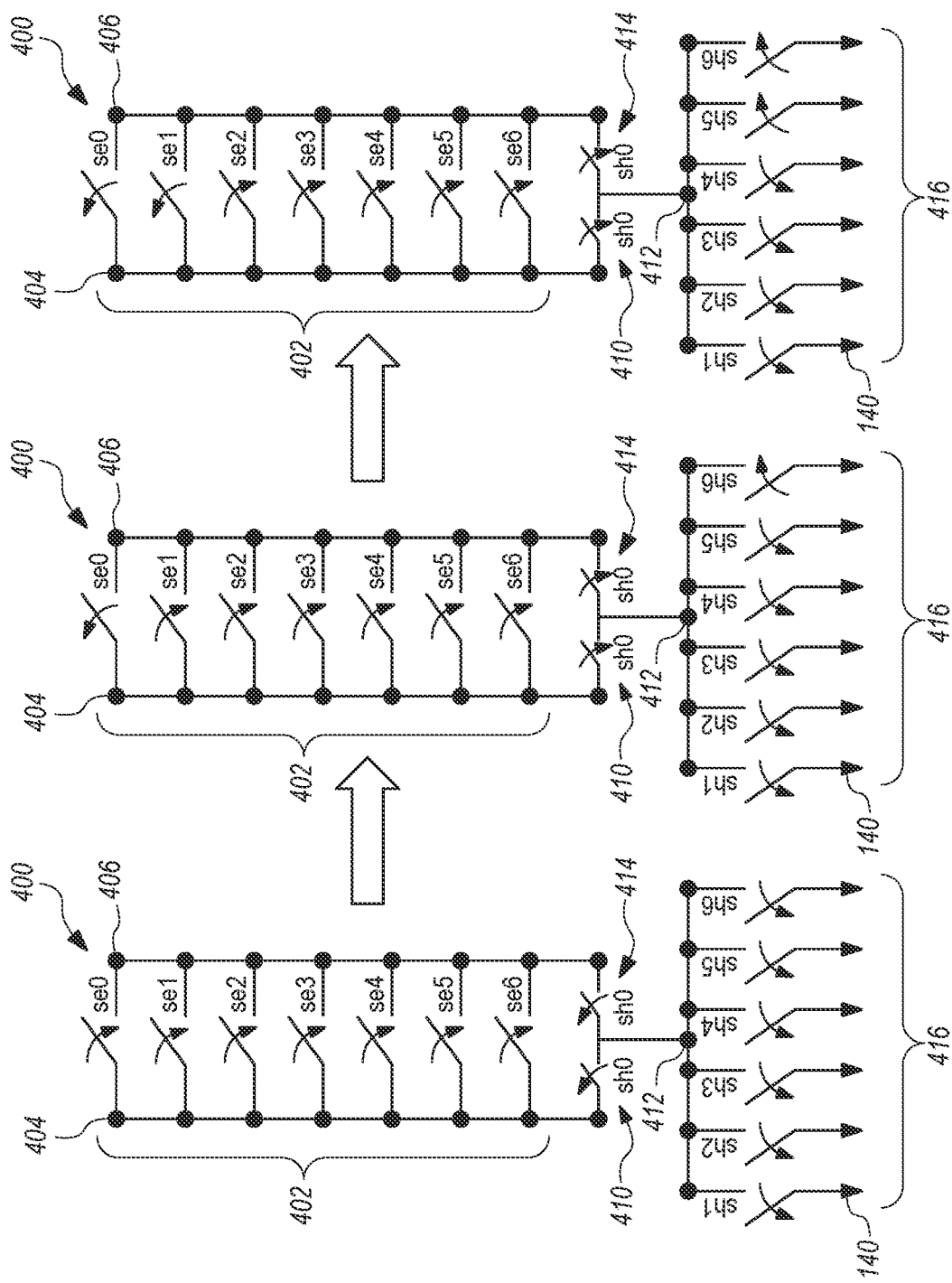

SPDT SWITCHES WITH EMBEDDED ATTENUATORS

RELATED APPLICATIONS

This application claims the benefit of U.S. Provisional patent application Ser. No. 63/282,973, filed on Nov. 24, 2021, the disclosure of which is hereby incorporated herein by reference in its entirety.

FIELD OF THE DISCLOSURE

The present disclosure relates generally to single-pole double-throw (SPDT) switches, and more particularly to SPDT switches with embedded attenuators.

BACKGROUND

Switches are frequently included in circuits to disconnect or connect a conducting path in the circuit. A switch that has a single input and two outputs is known as single pole double throw (SPDT) switch. In certain applications, such as radio frequency (RF) applications, an SPDT switch provides fast switching between the two outputs. However, the SPDT switch can result in higher insertion loss. Additionally or alternatively, the SPDT switch can consume a large amount of area on a die.

SUMMARY

Embodiments disclosed herein provide SPDT switches with embedded attenuators. In one aspect, an SPDT switch includes a transmitter attenuator circuit directly connected to a common input, and a receiver attenuator circuit directly connected to the common input. The transmitter attenuator circuit may include an inductor connected between a first node and a second node of the transmitter attenuator circuit, series switching elements connected in parallel between the first node and the second node, and shunt switching elements connected in parallel between a third node and a reference node, where the third node is connected between the first node and the second node. The receiver attenuator circuit can include an inductor connected between a third node and a fourth node of the receiver attenuator circuit, series switching elements connected in parallel between the third node and the fourth node, and shunt switching elements connected in parallel between a fifth node and a reference node, where the fifth node is connected between the third node and the fourth node.

In another aspect, a system includes the SPDT switch and a transceiver connected to a common input of the SPDT switch. The SPDT switch includes the transmitter attenuator circuit directly connected to the common input, and the receiver attenuator circuit directly connected to the common input. The system may further include an amplifier, such as a power amplifier, a low noise amplifier (LNA), a first decoder circuit, and a second decoder circuit. The amplifier is connected to a first node of the transmitter attenuator circuit through a transmitter signal line. The LNA is connected to a second node of the receiver attenuator circuit through a receiver signal line. The first decoder circuit may be connected to the control signal lines of the series switching elements and the shunt switching elements in the transmitter attenuator circuit. The second decoder circuit can be connected to the control signal lines of the series switching elements and the shunt switching elements in the receiver attenuator circuit. The first decoder circuit and the second decoder circuit are operable to provide control signals to selectively or individually open and close the series switching elements and the shunt switching elements in the transmitter attenuator circuit and the receiver attenuator circuit.

In yet another aspect, a method of operating an SPDT switch with embedded attenuators includes receiving an RF signal at a common input of the SPDT switch. The series switching elements and/or the shunt switching elements in the transmitter attenuator circuit and in the receiver attenuator circuit are selectively or individually set to an open state or to a closed state to directly connect the transmitter attenuator circuit or the receiver attenuator circuit to the common input. The selective setting of the states of the series switching elements and/or the shunt switching elements also determines a given amount of attenuation for the transmitter attenuator circuit or the receiver attenuator circuit. The RF signal is then transmitted to a respective output of the SPDT switch based on the states of the series switching elements and the shunt switching elements.

In another aspect, a method of operating an SPDT switch includes selectively opening and closing at least one of one or more series switches, or one or more shunt switching elements, in a transmitter attenuator circuit, and selectively opening and closing at least one of one or more series switches, or one or more shunt switching elements, in a receiver attenuator circuit. The selectively opening and closing in the transmitter attenuator circuit and in the receiver attenuator circuit directly connects the transmitter attenuator circuit to a common input of the SPDT switch. The selective opening and closing in the transmitter attenuator circuit produces a particular attenuation value for the transmitter attenuator circuit.

In yet another aspect, a method of operating an SPDT switch includes selectively opening and closing at least one of one or more series switches, or one or more shunt switching elements, in a transmitter attenuator circuit, and selectively opening and closing at least one of one or more series switches, or one or more shunt switching elements, in a receiver attenuator circuit. The selectively opening and closing in the transmitter attenuator circuit and in the receiver attenuator circuit directly connects the receiver attenuator circuit to a common input of the SPDT switch. The selective opening and closing in the receiver attenuator circuit produces a particular attenuation value for the receiver attenuator circuit.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 5A illustrates example switch settings for the series switching elements and the first, second, and third shunt switching elements for zero (0) decibels (dB) attenuation in accordance with embodiments of the disclosure;

FIG. 5B illustrates example switch settings for the series switching elements and the first, second, and third shunt switching elements for one (1) dB attenuation in accordance with embodiments of the disclosure;

FIG. 5C illustrates example switch settings for the series switching elements and the first, second, and third shunt switching elements for two (2) dB attenuation in accordance with embodiments of the disclosure;

DETAILED DESCRIPTION

Figure 1:
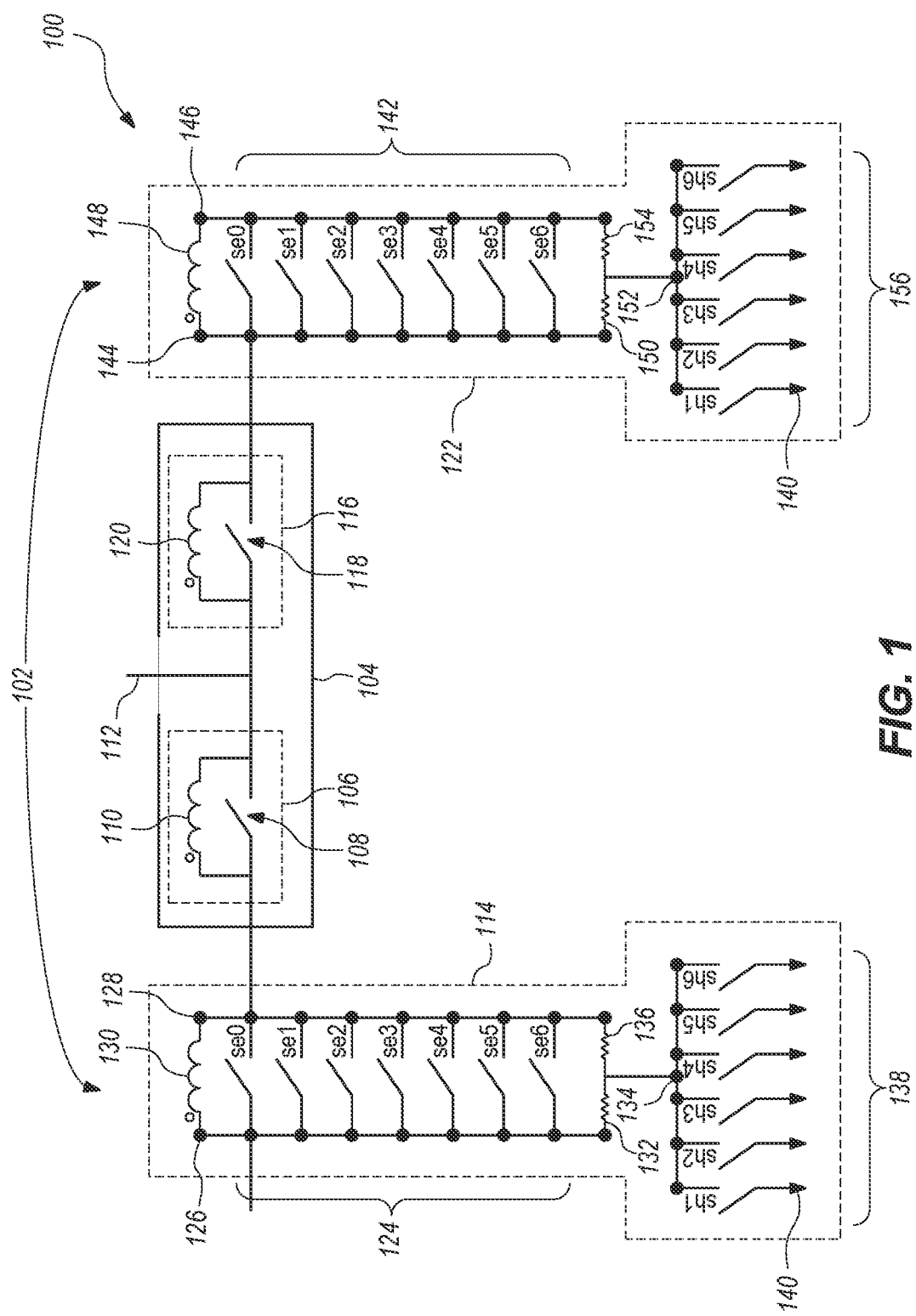
FIG. 1 illustrates a circuit that includes an attenuator connected in series with a single-pole double-throw (SPDT) switch in accordance with related art.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 illustrates a circuit 100 that includes an attenuator 102 connected in series with a single-pole double-throw (SPDT) switch 104 in accordance with related art. A transmitter switch 106 of the SPDT switch 104 includes a switch 108 connected in parallel with an inductor 110. The transmitter switch 106 is connected between a common input 112 and a transmitter attenuator circuit 114 of the attenuator 102. A receiver switch 116 of the SPDT switch 104 includes a switch 118 connected in parallel with an inductor 120. The receiver switch 116 is connected between the common input 112 and a receiver attenuator circuit 122 of the attenuator 102.

The transmitter attenuator circuit 114 includes multiple series switches 124 connected in parallel between a first node 126 and a second node 128. An inductor 130 is connected between the first node 126 and the second node 128. The transmitter switch 106 of the SPDT switch 104 is connected between the common input 112 and the second node 128 of the transmitter attenuator circuit 114.

The transmitter attenuator circuit 114 further includes a first resistor 132 connected between the first node 126 and a third node 134, and a second resistor 136 connected between the second node 128 and the third node 134. The third node 134 is connected between the first resistor 132 and the second resistor 136. Multiple shunt switches 138 are connected in parallel between the third node 134 and a reference node 140 (e.g., a reference voltage such as ground).

The construction of the receiver attenuator circuit 122 is similar to the construction of the transmitter attenuator circuit 114. The receiver attenuator circuit 122 includes multiple series switches 142 connected in parallel between a third node 144 and a fourth node 146. An inductor 148 is connected between the third node 144 and the fourth node 146. The receiver switch 116 of the SPDT switch 104 is connected between the common input 112 and the third node 144 of the receiver attenuator circuit 122.

The receiver attenuator circuit 122 further includes a third resistor 150 connected between the third node 144 and a fifth node 152, and a fourth resistor 154 connected between the fourth node 146 and the fifth node 152. The fifth node 152 is connected between the third node 144 and the fourth node 146. Multiple shunt switches 156 are connected in parallel between the fifth node 152 and the reference node 140 (e.g., ground). In FIG. 1, the first resistor 132, the second resistor 136, the third resistor 150, and the fourth resistor 154 each have a resistance value of fifty (50) ohms. In other embodiments, the first resistor 132, the second resistor 136, the third resistor 150, and/or the fourth resistor 154 may have different resistance values.

In some instances, the transmitter switch 106 and the receiver switch 116 cause the insertion loss of the SPDT switch 104 to be higher. Additionally or alternatively, the transmitter switch 106 and the receiver switch 116 increase an amount of area that is consumed by the SPDT switch 104 as the inductors 110, 120 dominate the overall area of the circuit 100.

Embodiments disclosed herein provide SPDT switches with embedded attenuators. In some instances, an SPDT switch with embedded attenuators is included system that uses radio frequency (RF) signals and/or high frequency RF signals. Example systems include, but are not limited to, mobile phones and systems that use 5G technology. The SPDT switch includes a transmitter attenuator circuit directly connected to a common input of the SPDT switch, and a receiver attenuator circuit directly connected to the common input of the SPDT switch. Series switching elements and shunt switching elements in the transmitter attenuator circuit and in the receiver attenuator circuit are selectively or individually set to an open state or to a closed state to directly connect the transmitter attenuator circuit or the receiver attenuator circuit to the common input. The selective setting of the states of the series switching elements and the shunt switching elements also determines a given amount of attenuation for the transmitter attenuator circuit or the receiver attenuator circuit. Although the SPDT switches with embedded attenuators are described in conjunction with a bridged tee topology, other embodiments are not limited to this configuration. An SPDT switch with embedded attenuators can be arranged in other topologies, such as a pi topology or a tee topology.

Figure 2:
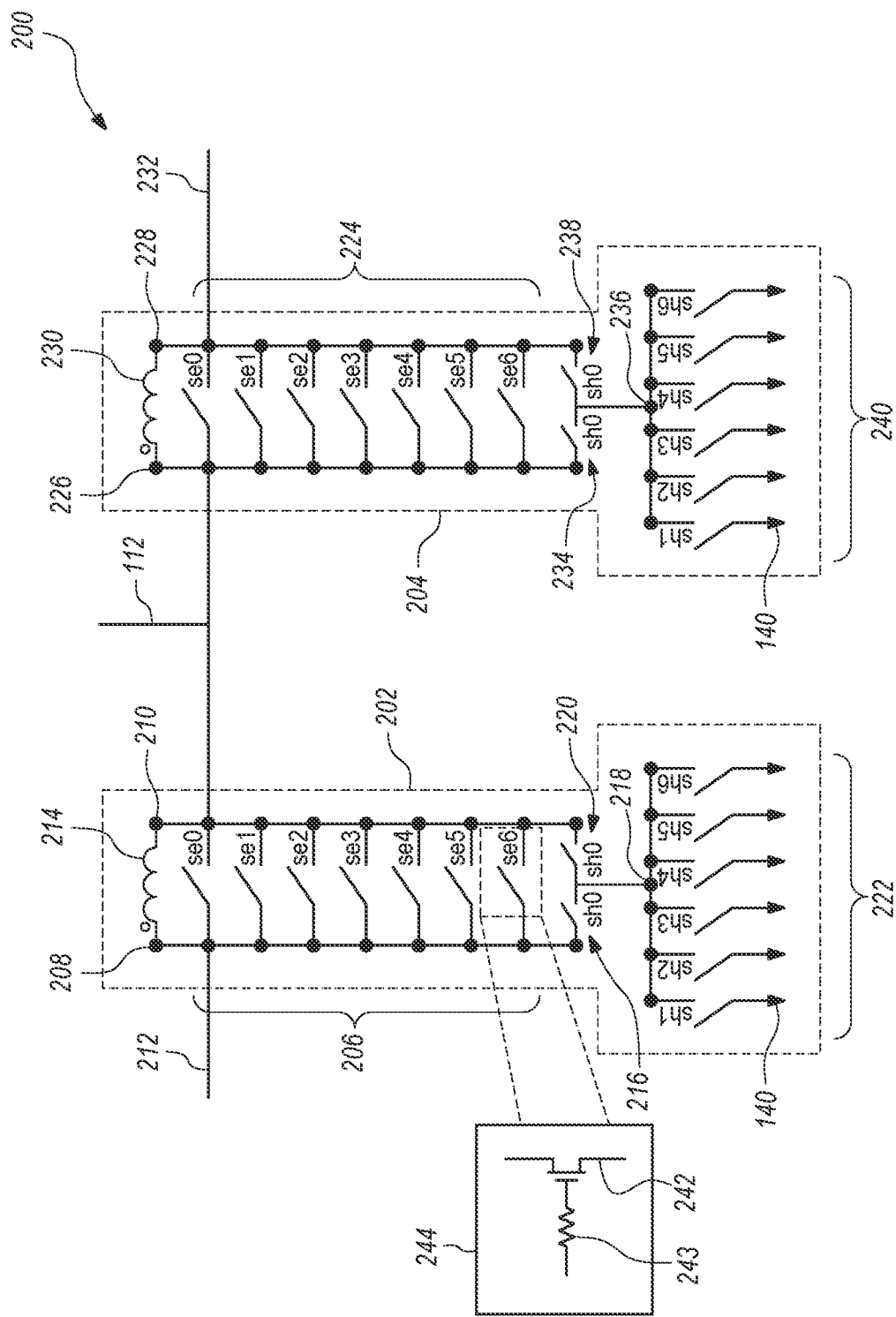
FIG. 2 illustrates a first example of an SPDT switch in accordance with embodiments of the disclosure.

FIG. 2 illustrates a first example of an SPDT switch 200 in accordance with embodiments of the disclosure. The SPDT switch 200 includes a transmitter attenuator circuit 202 and a receiver attenuator circuit 204. The transmitter attenuator circuit 202 and the receiver attenuator circuit 204 are directly connected in parallel to the common input 112. The transmitter attenuator circuit 202 includes one or more series switching elements (se0-se6) 206 connected in parallel between a first node 208 and a second node 210. A transmitter signal line 212 is connected to the first node 208. Although the illustrated embodiment depicts seven (7) series switching elements se0-se6, other embodiments are not limited to this implementation. The transmitter attenuator circuit 202 may include any number of series switching elements.

An inductor 214 in the transmitter attenuator circuit 202 is connected between the first node 208 and the second node 210. The common input 112 is directly connected to the second node 210 of the transmitter attenuator circuit 202. The transmitter attenuator circuit 202 further includes a first shunt switching element (sh0) 216 connected between the first node 208 and a third node 218, and a second shunt switching element (sh0) 220 connected between the second node 210 and the third node 218. The third node 218 is connected between the first node 208 and the second node 210. Multiple third shunt switching elements (sh1-sh6) 222 are connected in parallel between the third node 218 and the reference node 140 (e.g., ground). Although six (6) third shunt switching elements sh1-sh6 are shown in FIG. 2, other embodiments are not limited to this implementation. The transmitter attenuator circuit 202 may include any number of third shunt switching elements.

The construction of the illustrated receiver attenuator circuit 204 is similar to the construction of the transmitter attenuator circuit 202. In other embodiments, the construction of the transmitter attenuator circuit 202 and the construction of the receiver attenuator circuit 204 do not have to match. For example, the number of switching elements in the transmitter attenuator circuit 202 may differ from the number of switching elements in the receiver attenuator circuit 204.

The receiver attenuator circuit 204 includes one or more series switching elements (se0-se6) 224 connected in parallel between a third node 226 and a fourth node 228. A receiver signal line 232 is connected to the fourth node 228. Although seven (7) series switching elements se0-se6 are shown, other embodiments may include any number of series switching elements. An inductor 230 in the receiver attenuator circuit 204 is connected between the third node 226 and the fourth node 228. The common input 112 is directly connected to the third node 226 of the receiver attenuator circuit 204.

The receiver attenuator circuit 204 further includes a first shunt switching element (sh0) 234 connected between the third node 226 and a fifth node 236, and a second shunt switching element (sh0) 238 connected between the fourth node 228 and the fifth node 236. The fifth node 236 is connected between the third node 226 and the fourth node 228. Multiple third shunt switching elements (sh1-sh6) 240 are connected in parallel between the fifth node 236 and the reference node 140 (e.g., ground). Although six (6) third shunt switching elements sh1-sh6 are shown in FIG. 2, other embodiments are not limited to this implementation. The receiver attenuator circuit 204 may include any number of third shunt switching elements.

In certain embodiments, the first shunt switching element (sh0) 216 and the second shunt switching element 220 in the transmitter attenuator circuit 202, and the first shunt switching element (sh0) 234 and the second shunt switching element 238 in the receiver attenuator circuit 204 are each designed to approximate a particular resistance value. In a non-limiting nonexclusive embodiment, the resistance value is fifty (50) ohms. The particular resistance value can have a resistance value other than fifty (50) ohms in other embodiments.

The series switching elements (se0-se6) 206, 224, the first shunt switching elements (sh0) 216, 234, the second shunt switching elements (sh0) 220, 238, and the third shunt switching elements (sh1-sh6) 222, 240 can each be implemented as any type of a switch or switching element. In a non-limiting nonexclusive example, the series switching elements (se0-se6) 206, 224, the first shunt switching elements (sh0) 216, 234, the second shunt switching elements (sh0) 220, 238, and the third shunt switching elements (sh1-sh6) 222, 240 are each implemented as a transistor 242 with a resistor 243 connected to a gate of the transistor 242, as shown in an exploded view 244. One example of the transistor 242 is a field-effect transistor (e.g., a metal-oxide-semiconductor field-effect transistor (MOSFET)). In other embodiments, such as in higher linearity applications, the series switching elements (se0-se6) 206, 224, the first shunt switching elements (sh0) 216, 234, the second shunt switching elements (sh0) 220, 238, and/or the third shunt switching elements (sh1-sh6) 222, 240 can each be implemented as stacked silicon-on-insulator (SOI) switches.

Compared to the circuit 100 shown in FIG. 1, the SPDT switch 200 is comprised of only switching elements (e.g., transistors) in a signal path (e.g., an RF signal path). Accordingly, high isolation can be achieved by opening all of the series switching elements se0-se6 in the transmitter attenuator circuit 202 and/or the receiver attenuator circuit 204. For an SPDT operation, for example, in a transmit low loss mode, all of the series switching elements se0-se6 in the transmitter attenuator circuit 202 are turned on or set to a closed state to operate in a bypass mode, while all of the series switching elements se0-se6 and the third shunt switching elements sh1-sh6 in the receiver attenuator circuit 204 are turned off or set to an open state.

In a transmit (Tx) attenuation mode, one or more of the series switching elements se0-se6 and one or more of the third shunt switching elements sh1-sh6 in the transmitter attenuator circuit 202 are turned on (e.g., set to a closed state) with any remaining series switching elements se0-se6 and/or any remaining shunt switching elements sh1-sh6 in the transmitter attenuator circuit 202 turned off (e.g., set to an open state), while all of the series switching elements se0-se6 and all of the third shunt switching elements sh1-sh6 in the receiver attenuator circuit 204 are turned off (e.g., set to the closed state). Similarly, in a receive (Rx) attenuation mode, one or more of the series switching elements se0-se6 and one or more of the third shunt switching elements sh1-sh6 in the receiver attenuator circuit 204 are turned on (e.g., set to an open state) with any remaining series switching elements se0-se6 and/or any remaining third shunt switching elements sh1-sh6 in the receiver attenuator circuit 204 turned off (e.g., set to an open state), while all of the series switching elements se0-se6 and all of the third shunt switching elements sh1-sh6 in the transmitter attenuator circuit 202 are turned off (e.g., set to an open state).

One advantage to using the first shunt switching elements (sh0) 216, 234 and the second shunt switching elements (sh0) 220, 238 is that the first shunt switching elements (sh0) 216, 234 and the second shunt switching elements (sh0) 220, 238 can be turned on completely and turned off completely. The insertion loss of the SPDT switch 200 may be reduced when the first shunt switching element (sh0) 216 and the second shunt switching (sh0) 220 in the transmitter attenuator circuit 202 and/or the first shunt switching element (sh0) 234 and the second shunt switching element (sh0) 238 in the receiver attenuator circuit 204 are turned off completely. Additionally, the size or the amount of area consumed by the SPDT switch 200 can be smaller when the first shunt switching elements (sh0) 216, 234 and the second shunt switching elements (sh0) 220, 238 are used instead of the first resistor 132, the second resistor 136, the third resistor 150, and the fourth resistor 154 shown in FIG. 1.

Figure 3:
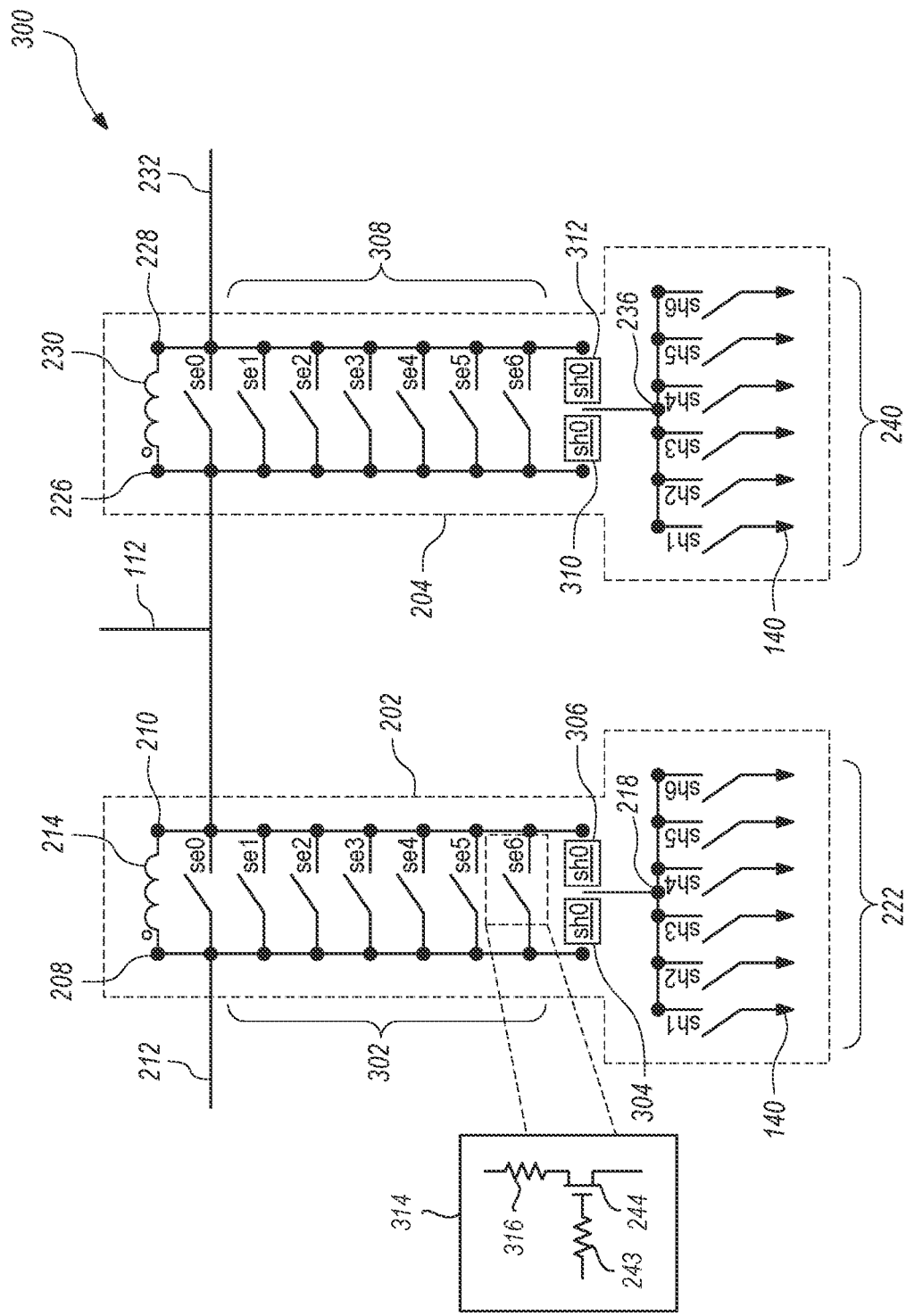
FIG. 3 illustrates a second example of an SPDT switch in accordance with embodiments of the disclosure.

FIG. 3 illustrates a second example of an SPDT switch 300 in accordance with embodiments of the disclosure. The SPDT switch 300 is similar to the SPDT switch 200 shown in FIG. 2 with the exception of the series switching elements (se1-se6) 302, the first shunt switching element (sh0) 304, and the second shunt switching element (sh0) 306 in the transmitter attenuator circuit 202, and the series switching elements (se1-se6) 308, the first shunt switching element (sh0) 310, and the second shunt switching element (sh0) 312 in the receiver attenuator circuit 204. An exploded view 314 depicts an example implementation of the series switching elements (se1-se6) 302, the first shunt switching element (sh0) 304, and/or the second shunt switching element (sh0) 306 in the transmitter attenuator circuit 202, and the series switching elements (se1-se6) 308, the first shunt switching element (sh0) 310, and/or the second shunt switching element (sh0) 312 in the receiver attenuator circuit 204. The exploded view 314 depicts a resistor 316 connected in series with the transistor 242 in that the resistor 316 is connected to a first terminal (e.g., a drain terminal) of the transistor 242. The resistor 243 is connected to the gate of the transistor 242. In a non-limiting nonexclusive example, the transistor 242 is a field-effect transistor (e.g., a MOSFET). In other embodiments, such as in higher linearity applications, the series switching elements (se0-se6) 206, 224, the first shunt switching elements (sh0) 216, 234, the second shunt switching elements (sh0) 220, 238, and/or the third shunt switching elements (sh1-sh6) 222, 240 can be implemented as stacked SOI switches.

In certain embodiments, some of the switching elements in the transmitter attenuator circuit 202 can be implemented as shown in the exploded view 244, while the other switching elements are implemented as shown in the exploded view 314. Additionally or alternatively, some of the switching elements in the receiver attenuator circuit 204 can be implemented as shown in the exploded view 244, while the remaining switching elements are implemented as shown in the exploded view 314.

For the series switching elements (se1-se6) 302 in the transmitter attenuator circuit 202, both the resistor 316 and the transistor 242 can be sized to have an overall Ron of the series switching elements 206 shown in FIG. 2. For the first shunt switching element (sh0) 304 and the second shunt switching element (sh0) 306 in the transmitter attenuator circuit 202, both the resistor 316 and the transistor 242 may be sized to have an overall Ron of fifty (50) ohms. The resistor 316 and the transistor 242 can be sized differently in other embodiments. In such embodiments, the series switching element se0 in the transmitter attenuator circuit 202 may be implemented as shown in the exploded view 244 of FIG. 2. This enables the transmitter attenuator circuit 202 to have a minimum or zero attenuation mode (e.g., Ron≈zero (0)). Alternatively, the series switching element se0 in the transmitter attenuator circuit 202 can be implemented as shown in the exploded view 314.

Similarly, for the series switching elements (se1-se6) 308 in the receiver attenuator circuit 204, both the resistor 316 and the transistor 242 are sized to have an overall Ron of the series switching elements 224 shown in FIG. 2. For the first shunt switching element (sh0) 310 and the second shunt switching element (sh0) 312 in the receiver attenuator circuit 204, both the resistor 316 and the transistor 242 may be sized to have an overall Ron of fifty (50) ohms. The resistor 316 and the transistor 242 can be sized differently in other embodiments. In such embodiments, the series switching element se0 in the receiver attenuator circuit 204 may be implemented as shown in the exploded view 244 of FIG. 2. This enables the receiver attenuator circuit 204 to have a minimum or zero attenuation mode (e.g., Ron≈zero (0)). Alternatively, the series switching element se0 in the receiver attenuator circuit 204 can be implemented as shown in the exploded view 314.

In certain embodiments, each of the series switching elements (se1-se6) 302, the first shunt switching element (sh0) 304, the second shunt switching element (sh0) 306, and the third shunt switching element (sh1-sh6) 222 in the transmitter attenuator circuit 202, and each of the series switching elements (se1-se6) 308, the first shunt switching element (sh0) 310, and the second shunt switching element (sh0) 312, and the third shunt switching elements (sh1-sh6) 240 in the receiver attenuator circuit 204 are implemented as shown in the exploded view 314. As noted previously, the series switching elements se0 in the transmitter attenuator circuit 202 and the receiver attenuator circuit 204 may be implemented as shown in the exploded view 244 of FIG. 2 or as shown in the exploded view 314 of FIG. 3.

In other embodiments, the series switching elements (se0-se6) 302 in the transmitter attenuator circuit 202 and the series switching elements (se0-se6) 308 in the receiver attenuator circuit 202 are implemented as shown in the exploded view 244 of FIG. 2, while the first shunt switching element 304 and the second shunt switching element 306 in the transmitter attenuator circuit 202 and the first shunt switching element 310 and the second shunt switching element 312 in the receiver attenuator circuit 204 are implemented as shown in the exploded view 314. In still other embodiments, the series switching elements (se1-se6) 302 in the transmitter attenuator circuit 202 and the series switching elements (se1-se6) 308 in the receiver attenuator circuit 202 are implemented as shown in the exploded view 314, while the first shunt switching element 304 and the second shunt switching element 306 in the transmitter attenuator circuit 202 and the first shunt switching element 310 and the second shunt switching element 312 in the receiver attenuator circuit 204 are implemented as shown in the exploded view 244 of FIG. 2.

Figures 4A, 4B, 4C:
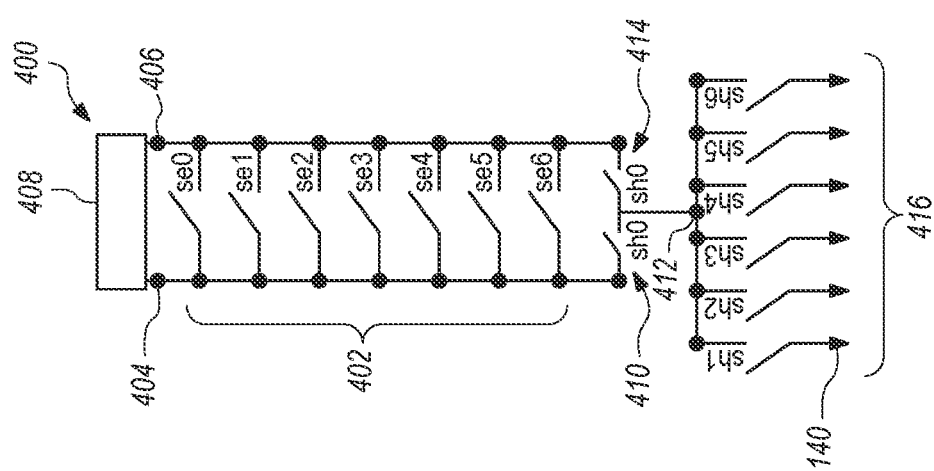
FIG. 4A illustrates an example attenuator circuit for an SPDT switch in accordance with embodiments of the disclosure.
FIG. 4B illustrates a table showing example ON resistance values (Ron) for each series and each first, second, and third shunt switching elements shown in FIG. 4A in accordance with embodiments of the disclosure.
FIG. 4C illustrates a table showing example widths of each series and each first, second, and third shunt switching elements to represent the Ron values shown in FIG. 4B in accordance with embodiments of the disclosure.

FIG. 4A illustrates an example attenuator circuit 400 for an SPDT switch in accordance with embodiments of the disclosure. The illustrated attenuator circuit 400 may be the transmitter attenuator circuit 202 and/or the receiver attenuator circuit 204 shown in FIG. 2. The attenuator circuit 400 is configured as a six-bit bridged tee switch.

The attenuator circuit 400 includes one or more series switching elements 402 connected in parallel between a first node 404 and a second node 406. Although the illustrated embodiment depicts seven (7) series switching elements se0-se6, other embodiments are not limited to this implementation. The attenuator circuit 400 may include any number of series switching elements.

An inductor 408 is connected between the first node 404 and the second node 406. A first shunt switching element (sh0) 410 is connected between the first node 404 and a third node 412, and a second shunt switching element (sh0) 414 is connected between the second node 406 and the third node 412. The third node 412 is connected between the first node 404 and the second node 406. Third shunt switching elements 416 are connected in parallel between the third node 412 and the reference node 140 (e.g., ground). Although six (6) third shunt switching elements sh1-sh6 are shown in FIG. 4, other embodiments are not limited to this implementation. The attenuator circuit 400 may include any number of third shunt switching elements.

FIG. 4B illustrates a table 418 showing example Ron values for each series switching element se0-se6 and each of the first, second, and third shunt switching elements sh0-sh6 shown in FIG. 4A in accordance with embodiments of the disclosure. To provide zero (0) to six (6) dB attenuation in one (1) dB steps, each series switching element se0-se6, the first shunt switching element (sh0) 410, the second shunt switching element (sh0) 414, and each third shunt switching element sh1-sh6 present, and are sized to present, the example Ron values shown in the table 418 (the resistance values are in ohms). A resistance R_0 is associated with the series switching element se0, the first shunt switching element (sh0) 410, and the second shunt switching element (sh0) 412. For R_0, the Ron value of se0 is four and eight tenths (4.8) ohms and the Ron value of both of the first shunt switching element sh0 and the second shunt switching element sh0 is fifty (50) ohms. A resistance R_1 is associated with the series switching element se1 and the third shunt switching element sh1. For R_1, the Ron value of se1 is eleven and a half (11.5) ohms and the Ron value of sh1 is two hundred and thirty (230) ohms. A resistance R_2 is associated with the series switching element se2 and the third shunt switching element sh2. For R_2, the Ron value of se2 is thirty-five (35) ohms and the Ron value of sh2 is two hundred and fifty-nine (259) ohms. A resistance R_3 is associated with the series switching element se3 and the third shunt switching element sh3. For R_3, the Ron value of se3 is seventy (70) ohms and the Ron value of sh3 is two hundred and ninety (290) ohms. A resistance R_4 is associated with the series switching element se4 and the third shunt switching element sh4. For R_4, the Ron value of se4 is one hundred and eighteen (118) ohms and the Ron value of sh4 is three hundred and twenty-five (325) ohms. A resistance R_5 is associated with the series switching element se5 and the third shunt switching element sh5. For R_5, the resistance value of se5 is one hundred and seventy-eight (178) ohms and the resistance value of sh5 is three hundred and sixty-five (365) ohms. A resistance R_6 is associated with the series switching element se6 and the third shunt switching element sh6. For R_6, the Ron value of se6 is fifty (50) ohms and the Ron value of sh6 is four hundred and ten (410) ohms.

As shown in FIG. 4B, the individual series switching elements se0-se6 and the individual first, second, and third shunt switching elements sh0-sh6 can be sized to provide a given resistance for attenuation. In embodiments where the series switching elements 402, the first shunt switching element (sh0) 410, the second shunt switching element (sh0) 414, and the third shunt switching elements 416 are implemented as transistors (e.g., transistor 242 in FIG. 2), the SPDT switch may be further optimized by adjusting the gate bias voltage of the transistors, since the Ron of each transistor is a function of gate voltage.

FIG. 4C illustrates a table 420 showing example widths of each series switching element se0-se6 and each of the first, second, and third shunt switching elements sh0-sh6 to represent the Ron values shown in FIG. 4B in accordance with embodiments of the disclosure. The example widths are shown in micrometers (um). A switch width SW_0 is associated with the series switching element se0, the first shunt switching element (sh0) 410, and the second shunt switching element (sh0) 414. For SW_0, the width of se0 is three hundred twenty-two (322) um and the width of sh0 is thirty-one and a half (31.5) um.

A switch width SW_1 is associated with the series switching element se1 and the third shunt switching element sh1. For SW_1, the width of se1 is one hundred and thirty-five (135) um and the width of sh1 is six and eight tenths (6.8) um. A switch width SW_2 is associated with the series switching element se2 and the third shunt switching element sh2. For SW_2, the width of se2 is forty-five (45) um and the width of sh2 is six (6) um. A switch width SW_3 is associated with the series switching element se3 and the third shunt switching element sh3. For SW_3, the width of se3 is twenty-two and a half (22.5) um and the width of sh3 is five and four tenths (5.4) um. A switch width SW_4 is associated with the series switching element se4 and the third shunt switching element sh4. For SW_4, the width of se4 is thirteen and three tenths (13.3) um and the width of sh4 is four and eight tenths (4.8) um. A switch width SW_5 is associated with the series switching element se5 and the third shunt switching element sh5. For SW_1, the width of se5 is eight and eight tenths (8.8) um and the width of sh5 is four and three tenths (4.3) um. A switch width SW_6 is associated with the series switching element se6 and the third shunt switching element sh6. For SW_6, the width of se6 is thirty-one and a half (31.5) um and the width of sh6 is three and eight tenths (3.8) um.

As noted previously, the Ron values shown in table 418 and the switch widths shown in the table 420 are for illustrative purposes only. Other embodiments can use different Ron values and/or switch widths to obtain the same range of attenuation and/or the same dB steps (e.g., zero (0) to six (6) dB attenuation in one (1) dB steps), or to obtain different ranges of attenuation and/or different dB steps. For example, FIGS. 8A-8D depict an embodiment in which a range of attenuation is obtained in steps that are less than one (1) dB.

As noted previously, the attenuator circuit 400 shown in FIG. 4A can be the transmitter attenuator circuit 202 and/or the receiver attenuator circuit 204 shown in FIG. 2. Also, the example Ron values in FIG. 4B and the example switch widths in FIG. 4C are associated with the attenuator circuit 400 shown in FIG. 4A. However, those skilled in the art will recognize that Ron values and switch widths can be determined for the transmitter attenuator circuit 202 and the receiver attenuator circuit 204 shown in FIG. 3.

As described in conjunction with FIG. 4A, a transmitter attenuator circuit (e.g., the transmitter attenuator circuit 202 shown in FIG. 2) and a receiver attenuator circuit (e.g., the receiver attenuator circuit 204 in FIG. 2) can provide different amounts of attenuation in steps of one (1) dB. FIGS. 5A-5C illustrate example settings for the series switching elements se0-se6 and the first, second, and third shunt switching elements sh0-sh6 for attenuation values between zero (0) to two (2) dB in one (1) dB steps.

FIG. 5A illustrates example switch settings for the series switching elements 402, the first shunt switching element 410, the second shunt switching element 414, and the third shunt switching elements 416 for zero (0) decibels (dB) attenuation in accordance with embodiments of the disclosure. All of the series switching elements se0-se6 are turned on (e.g., set to a closed state as represented by the rightward pointing arrows). The first shunt switching element (sh0) 410 and the second shunt switching element (sh0) 414 are turned off (e.g., set to an open state as represented by the leftward pointing arrows). The third shunt switching elements sh1-sh6 are turned off (e.g., set to an open state as represented by the leftward pointing arrows).

One or more select series switching elements and/or one or more of the first, second, and third shunt switching elements change state to step up from zero (0) attenuation to one (1) dB attenuation. FIG. 5B illustrates example switch settings for the series switching elements 402, the first shunt switching element 410, the second shunt switching element 414, and the third shunt switching elements 416 for one (1) dB attenuation in accordance with embodiments of the disclosure. The series switching element se0 changes state to an open state while the remaining series switching elements se1-se6 remain in the closed state. The first shunt switching element (sh0) 410 and the second shunt switching element (sh0) 414 change states to closed states. The third shunt switching element se6 changes state to the closed state (as represented by the rightward pointing arrow), while the remaining third shunt switching elements sh1-sh5 remain in the open state.

One or more additional select series switching elements and/or one or more first, second, and third shunt switching elements change state to step up from one (1) dB attenuation to two (2) dB attenuation. FIG. 5C illustrates example switch settings for the series switching elements 402, the first shunt switching element 410, the second shunt switching element 414, and the third shunt switching elements 416 for two (2) dB attenuation in accordance with embodiments of the disclosure. The series switching element se0 remains in the open state, and the series switching element se1 changes state to the open state. The remaining series switching elements se2-se6 remain in the closed state. The third shunt switching element sh5 changes state to the closed state (as represented by the rightward pointing arrow). The first shunt switching element (sh0) 410, the second shunt switching element (sh0) 414, and the third shunt switching element sh6 remain in the closed state, while the remaining third shunt switching elements sh1-sh4 remain in the open state.

Figure 6:
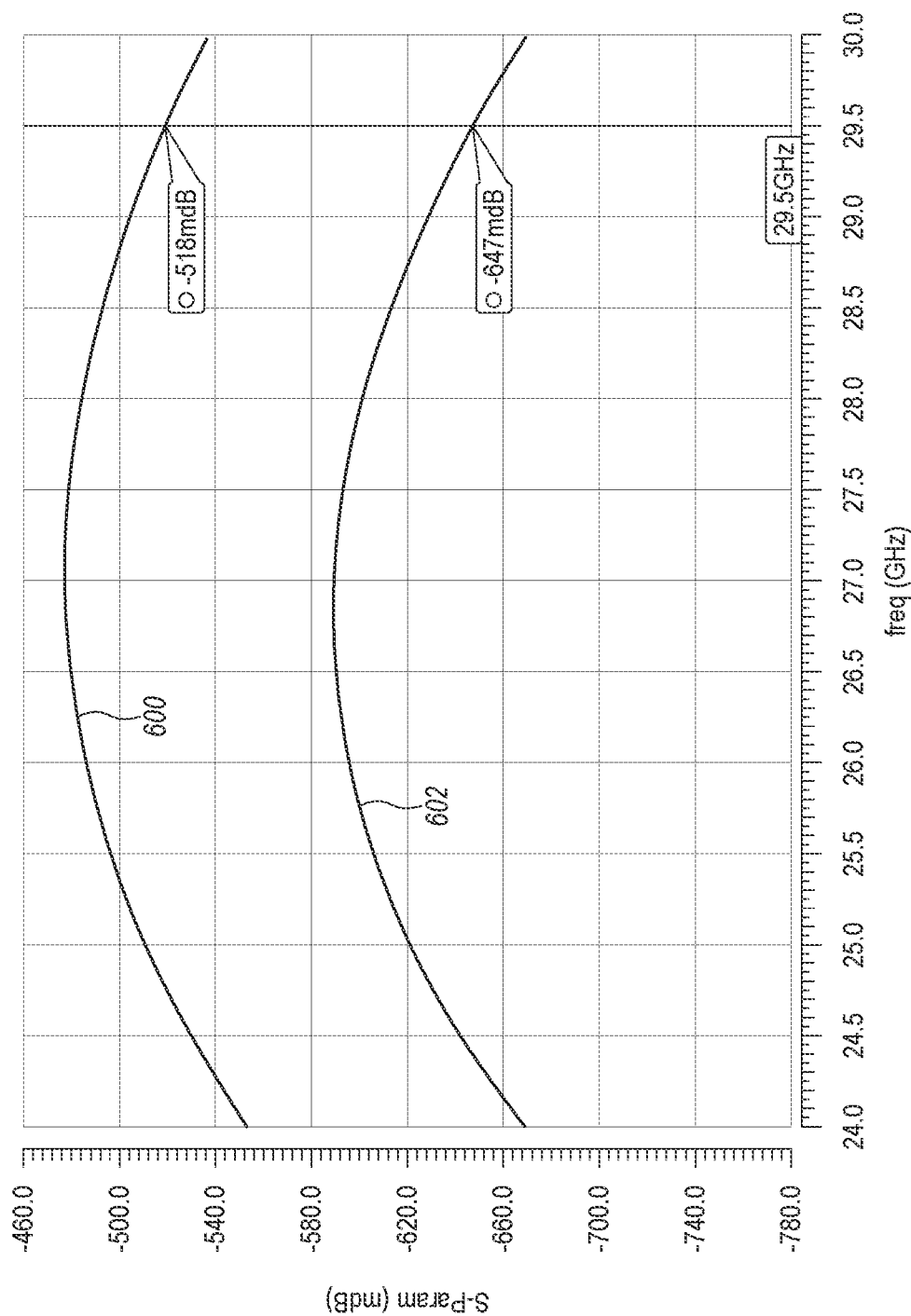
FIG. 6 illustrates a graph depicting example plots of an insertion loss of the circuit shown in FIG. 1 and an insertion loss of an SPDT switch in accordance with embodiments of the disclosure.

FIG. 6 illustrates a graph depicting an example plot 600 of an insertion loss of the circuit shown in FIG. 1 and a plot 602 of an insertion loss of an SPDT switch in accordance with embodiments of the disclosure. The vertical axis represents S-parameter values in millidecibels (mdB), and the horizontal axis represents frequency in gigahertz (GHz). The frequency range on the horizontal axis ranges from twenty-four (24) GHz to thirty (30) GHz.

A plot 602 represents the insertion loss of the SPDT switch at the lowest attenuation setting. For example, in FIG. 2, the bypass mode provides the lowest attenuation setting. In the bypass mode, all of the series switching elements se0-se6 in the transmitter attenuator circuit 202 are turned on (e.g., set to the closed state) while all of the first, second, and third shunt switching elements sh0-sh6 are turned off (e.g., set to the open state). The series switching elements se0-se6 and all of the first, second, and third shunt switching elements sh0-sh6 in the receiver attenuator circuit 204 are turned off (e.g., set to the open state). As shown, the insertion loss in the plot 600 is higher across the frequency range compared to the insertion loss in the plot 602. SPDT switches in accordance with the disclosure achieve lower insertion loss by having, in part, the SPDT switches perform the attenuator function along with the SPDT function. The omission of the SPDT switch 104 shown in FIG. 1 from the SPDT switch 200 in FIG. 2 and the SPDT switch 300 in FIG. 3 reduces the amount of insertion loss.

Figure 7:
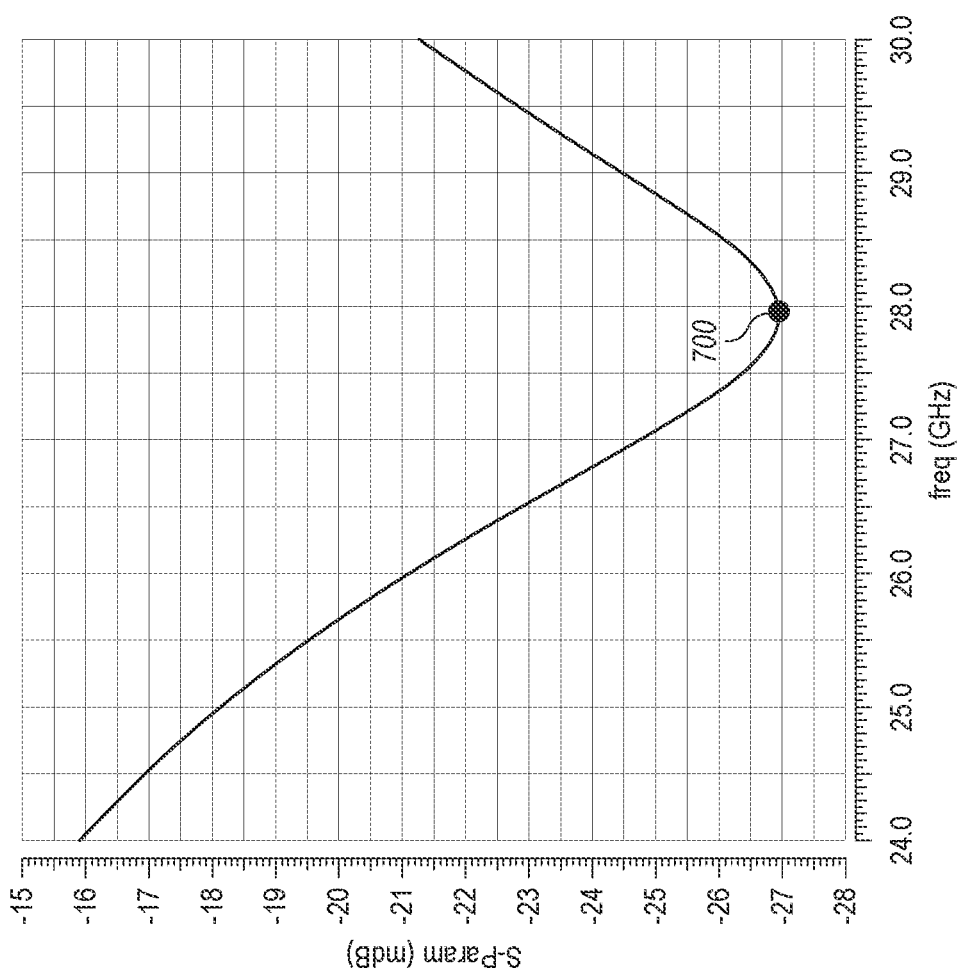
FIG. 7 illustrates a plot of the isolation of the SPDT switch shown in FIG. 2 with all series switching elements and all of the first, second, and third shunt switching elements turned off in accordance with embodiments of the disclosure.

FIG. 7 illustrates a plot of the isolation of the SPDT switch shown in FIG. 2 with all series switching elements and all of the first, second, and third shunt switching elements turned off in accordance with embodiments of the disclosure. The vertical axis represents S-parameter values in mdB, and the horizontal axis represents frequency in GHz. The frequency range on the horizontal axis ranges from twenty-four (24) GHz to thirty (30) GHz.

The high isolation mode is produced when all of the series switching elements, the first shunt switching element, the second shunt switching element, and all of the third shunt switching elements in the transmitter attenuator circuit or in the receiver attenuator circuit are turned off. In some instances, for the high isolation mode, the only resistor(s) in the SPDT switch is the resistor(s) associated with the Ron of one or more series switching elements. In this manner, the capacitance resonates with the parallel inductor and the maximum quality factor can be achieved. As shown in FIG. 7, a point 700 represents the highest isolation when all of the series switching elements, the first shunt switching element, the second shunt switching element, and all of the third shunt switching elements in the transmitter attenuator circuit or the receiver attenuator circuit of FIG. 3 are turned off.

As described earlier, in some embodiments, a range of attenuation values may be obtained in steps that are greater or less than one (1) dB. In a non-limiting nonexclusive example, FIGS. 8A-8D depict an embodiment in which a range of attenuation values is obtained in one-half (0.5) dB steps. The one-half (0.5) dB step is achieved without one or more additional transmitter attenuator circuits and without one or more additional receiver attenuator circuits (e.g., the transmitter attenuator circuit 202 and the receiver attenuator circuit 204 shown in FIG. 2 or in FIG. 3).

Figure 8:
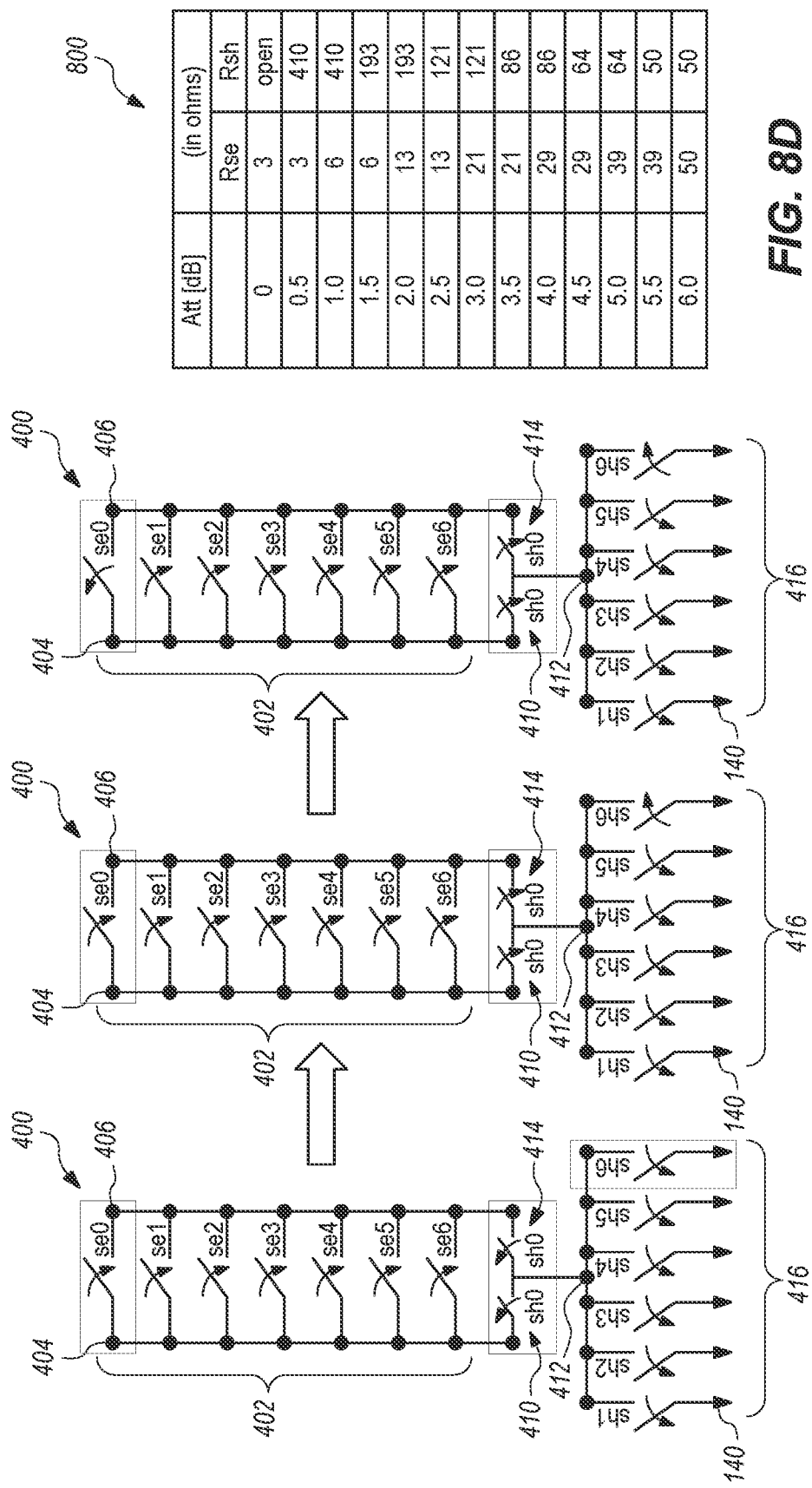
FIG. 8A illustrates example switch settings for zero (0) dB attenuation in accordance with embodiments of the disclosure.
FIG. 8B illustrates example switch settings for one-half (0.5) dB attenuation in accordance with embodiments of the disclosure.
FIG. 8C illustrates example switch settings for one (1) dB attenuation in accordance with embodiments of the disclosure.
FIG. 8D illustrates a table 800 of example attenuations and associated example resistance values for the series switching elements, the first shunt switching element, the second shunt switching element, and the third shunt switching elements shown in FIGS. 8A-8C in accordance with embodiments of the disclosure.

FIG. 8A illustrates example switch settings for zero (0) decibels (dB) attenuation in the example attenuator circuit 400 shown in FIG. 4 in accordance with embodiments of the disclosure. As described previously, the example attenuator circuit 400 may be the transmitter attenuator circuit 202 or the receiver attenuator circuit 204 shown in FIG. 2. The inductor 408 is included in the attenuator circuit 400, but for simplicity, the inductor 408 is not shown in FIGS. 8A-8C.

In a non-limiting nonexclusive example, the attenuator circuit 400 is operable to provide zero (0) to six (6) dB attenuation in one-half (0.5) dB steps. As shown in FIG. 8A, for zero (0) dB attenuation, all of the series switching elements se0-se6 are turned on (e.g., set to a closed state), as represented by rightward pointing arrows. The first shunt switching element (sh0) 410 and the second shunt switching element (sh0) 414 are turned off (e.g., set to an open state as represented by leftward pointing arrows). All of the third shunt switching elements sh1-sh6 are also turned off (e.g., set to an open state as represented by leftward pointing arrows).

One or more select series switching elements and/or one or more of the first, second, and third shunt switching elements change state to step up from zero (0) attenuation to one-half (0.5) dB attenuation. FIG. 8B illustrates example switch settings for one-half (0.5) dB attenuation in the example attenuator circuit 400 shown in FIG. 4 in accordance with embodiments of the disclosure. For one-half (0.5) dB attenuation, all of the series switching elements se0-se6 remain in the closed state. The first shunt switching element (sh0) 410 and the second shunt switching element 414 change states to the closed state (as represented by rightward pointing arrows). The third shunt switching element sh6 changes state to the closed state (represented by the rightward pointing arrow), while all of the remaining third shunt switching elements sh1-sh5 remain in the open state.

One or more additional select series switching elements and/or one or more of the first, second, and third shunt switching elements change state to step up from one-half (0.5) attenuation to one (1) dB attenuation. FIG. 8C illustrates example switch settings for one (1) dB attenuation in the example attenuator circuit 400 shown in FIG. 4 in accordance with embodiments of the disclosure. For one (1) dB attenuation, the series switching element se0 changes state to the open state (represented by the leftward pointing arrow) while all of the remaining series switching elements se1-se6 remain in the closed state. The first shunt switching element (sh0) 410, the second shunt switching element (sh0) 414, and the third shunt switching element sh6 remain in the closed state, while all of the remaining third shunt switching elements sh1-sh5 remain in the open state.

FIG. 8D illustrates a table 800 of example attenuations and associated example resistance values for the series switching elements, the first shunt switching element, the second shunt switching element, and the third shunt switching elements shown in FIGS. 8A-8C in accordance with embodiments of the disclosure. The resistance values for the resistance (Rse) of the series switching elements se0-se6 represent the total resistance of all of the series switching elements se0-se6. The resistance values for the resistance (Rsh) of the first shunt switching element (sh0) 410, the second shunt switching element (sh0) 414, and the third shunt switching elements sh1-sh6 represent the total resistance of all of the shunt switching element (the first shunt switching element (sh0) 410, the second shunt switching element (sh0) 414, and the third shunt switching elements sh1-sh6. For example, the Rse value for zero (0) dB attenuation is three (3) ohms, and the Rsh value is open because all of the first, second, and third shunt switching elements sh0-sh6 are in the open state, as shown in FIG. 8A.

For one-half (0.5) dB attenuation, the Rse value remains at three (3) ohms while the Rsh value is set to four hundred and ten (410) ohms. Since all of the series resistors se0-se6 remain in the closed state (as shown in FIG. 8B), the Rse value does not change. The Rsh value is set to four hundred and ten (410) ohms due to the change in states to the closed state of the first shunt switching element (sh0) 410, the second shunt switching element (sh0) 414, and the third shunt switching element sh6 (FIG. 8B).

For one (1) dB attenuation, the Rse value increases to six (6) ohms and the Rsh value remains at four hundred and ten (410) ohms. Since the states of the first shunt switching element (sh0) 410, the second shunt switching element (sh0) 414, and the third shunt switching elements sh1-sh6 do not change for one (1) dB attenuation, the Rsh value does not change. The Rse value increases due to the change in state to the open state of the series switching element se0 (FIG. 8C). Continuing with the example Rse and Rsh values in the table 800, the Rse value remains at six (6) ohms and the Rsh value decreases to one hundred and ninety-three (193) ohms for one and one-half (1.5) dB attenuation. Thus, the states of the series switching elements se0-se6 do not change, the states of the first shunt switching element (sh0) 410, the second shunt switching element (sh0) 414, and the third shunt switching element sh6 do not change, and the states of one or more of the third shunt switching elements sh1-sh5 changes to a closed state.

For two (2) dB attenuation, the Rse value increases to thirteen (13) ohms and the Rsh value remains at one hundred and ninety-three (193) ohms. The increase in the Rse value is due to a change in state (e.g., change to an open state) of one or more of the series switching elements se1-se6.

For two and one-half (2.5) dB attenuation, the Rse value remains at thirteen (13) ohms while the Rsh value decreases to one hundred and twenty-one (121) ohms. The decrease in the Rsh value is due to a change in state (e.g., change to an open state) of one or more of the third shunt switching elements sh1-sh5. The first shunt switching element (sh0) 410 and the second shunt switching element (sh0) 414 remain in a closed state.

For three (3) dB attenuation, the Rse value increases to twenty-one (21) ohms while the Rsh value remains at one hundred and twenty-one (121) ohms. The increase in the Rse value is due to a change in state (e.g., change to an open state) of one or more of the series switching elements se1-se6.

For three and one-half (3.5) dB attenuation, the Rse value remains at twenty-one (21) ohms while the Rsh value decreases to eighty-six (86) ohms. The decrease in the Rsh value is due to a change in state (e.g., change to a closed state) of one or more of the third shunt switching elements sh1-sh5. The first shunt switching element (sh0) 410 and the second shunt switching element (sh0) 414 remain in a closed state.

For four (4) dB attenuation, the Rse value increases to twenty-nine (29) ohms while the Rsh value remains at eighty-six (86) ohms. The increase in the Rse value is due to a change in state (e.g., change to an open state) of one or more of the series switching elements se1-se6.

For four and one-half (4.5) dB attenuation, the Rse value remains at twenty-nine (29) ohms while the Rsh value decreases to sixty-four (64) ohms. The decrease in the Rsh value is due to a change in state (e.g., change to a closed state) of one or more of the third shunt switching elements sh1-sh5. The first shunt switching element (sh0) 410 and the second shunt switching element (sh0) 414 remain in a closed state.

For five (5) dB attenuation, the Rse value increases to thirty-nine (39) ohms while the Rsh value remains at sixty-four (64) ohms. The increase in the Rse value is due to a change in state (e.g., change to an open state) of one or more of the series switching elements se1-se6.

For five and one-half (5.5) dB attenuation, the Rse value remains at thirty-nine (39) ohms while the Rsh value decreases to fifty (50) ohms. The decrease in the Rsh value is due to a change in state (e.g., change to an open state) of one or more of the third shunt switching elements 416. The first shunt switching element (sh0) 410 and the second shunt switching element (sh0) 414 remain in a closed state.

For six (6) dB attenuation, the Rse value increases to fifty (50) ohms while the Rsh value remains at fifty (50) ohms. The increase in the Rse value is due to a change in state (e.g., change to an open state) of one or more of the series switching elements se1-se6.

The Rse and the Rsh values in the table 800 are example values. Other embodiments can use different Rse and/or different Rsh values to obtain the same range of attenuation and/or the same dB steps (e.g., zero (0) to six (6) dB attenuation in one-half (0.5) dB steps) or to obtain different ranges of attenuation and/or different dB steps.

As noted previously, the attenuator circuit 400 shown in FIGS. 8A-8C can be the transmitter attenuator circuit 202 and/or the receiver attenuator circuit 204 shown in FIG. 2. Also, the example Rse values and the example Rsh values in FIG. 8D are associated with the attenuator circuit 400 shown in FIGS. 8A-8C. However, those skilled in the art will recognize that Rse values and Rsh values can be determined for the transmitter attenuator circuit 202 and the receiver attenuator circuit 204 shown in FIG. 3.

Figure 9:
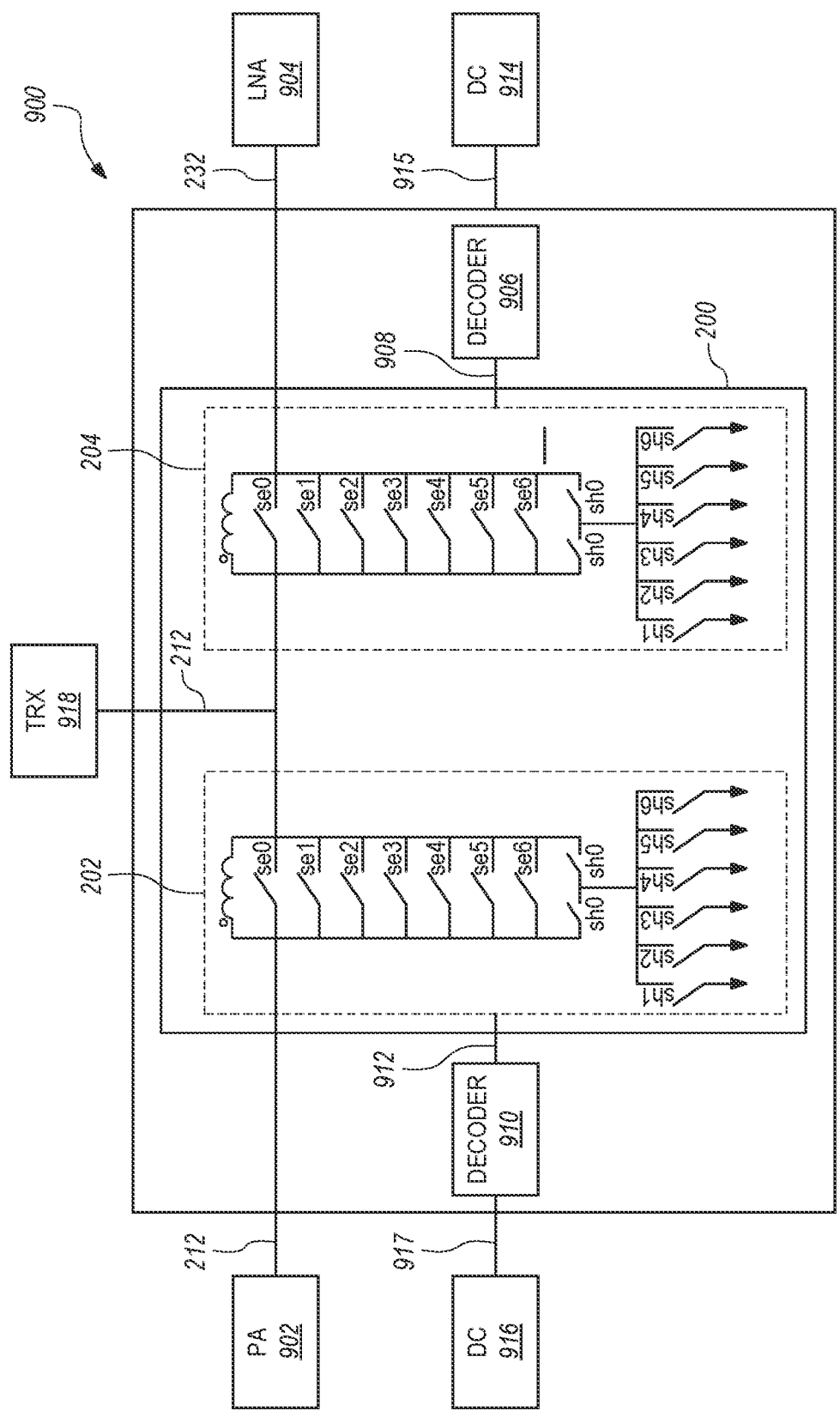
FIG. 9 illustrates a block diagram of a first example system that may include one or more SPDT switches in accordance with embodiments of the disclosure.

FIG. 9 illustrates a block diagram of a first example system 900 that may include one or more SPDT switches 200 in accordance with embodiments of the disclosure. The system 900 includes the SPDT switch 200 shown in FIG. 2. In other embodiments, the system 900 may include the SPDT switch 300 shown in FIG. 3.

The system 900 further includes an amplifier 902, such as a power amplifier (PA), connected to the transmitter attenuator circuit 202 via the transmitter signal line 212. An LNA 904 is connected to the receiver attenuator circuit 204 via the receiver signal line 232. A first decoder circuit 906 is connected to each of the series switching elements se0-se6 and to each of the first, second, and third shunt switching elements sh0-sh6 in the receiver attenuator circuit 204. The first decoder circuit 906 provides control signals that cause the series switching elements se0-se6 and the first, second, and third shunt switching elements sh0-sh6 to be individually set to the open state or the closed state. In certain embodiments, a respective control signal line connects to each series switching element se0-se6 and each first, second, and third shunt switching elements sh0-sh6 to the first decoder circuit 906. Thus, the number of control signal lines matches a sum of the number of series switching elements se0-se6 and the number of first, second, and third shunt switching elements sh0-sh6. A control signal line 908 represents the multiple control signal lines between the first decoder circuit 906 and the series switching elements se0-se6 and the first, second, and third shunt switching elements sh0-sh6 in the receiver attenuator circuit 204.

A second decoder circuit 910 is connected to each of the series switching elements se0-se6 and each of the first, second, and third shunt switching elements sh0-sh6 in the transmitter attenuator circuit 202. The second decoder circuit 910 provides control signals that cause the series switching elements se0-se6 and the first, second, and third shunt switching elements sh0-sh6 to be selectively set to the open state or the closed state. In certain embodiments, a respective control signal line connects each series switching element se0-se6 and each first, second, and third shunt switching element sh0-sh6 to the second decoder circuit 910. Thus, the number of control signal lines is a sum of the number of series switching elements se0-se6 and the number of first, second, and third shunt switching elements sh0-sh6. A control signal line 912 represents the multiple control signal lines between the second decoder circuit 910 and the series switching elements se0-se6 and the first, second, and third shunt switching elements sh0-sh6 in the transmitter attenuator circuit 202.

The first decoder circuit 906 is connected to first digital circuitry (DC) 914 via a signal line 915. The second decoder circuit 910 is connected to second digital circuitry (DC) 916 via a signal line 917. The first digital circuitry 914 and the second digital circuitry 916 are operable to provide address or control signals to enable the first decoder circuit 906 and the second decoder circuit 910, respectively, to selectively open and selectively close respective series switching elements se0-se6 and respective first, second, and third shunt switching elements sh0-sh6 in real time to obtain a particular attenuation. In some embodiments, the first digital circuitry 914 and the second digital circuitry 916 are the same digital circuitry (e.g., a digital core).

In certain embodiments, the common input 112 is connected to a transceiver circuit (TRX) 918. The transceiver circuit 918 transmits an RF signal on the common input 112. Depending on the states of the series switching elements se0-se6 and the first, second, and third shunt switching elements sh0-sh6 in the transmitter attenuator circuit 202 and in the receiver attenuator circuit 204, the RF signal propagates to one of the amplifier 902 or the LNA 904 at a given attenuation. By changing the state of one or more series switching elements se0-se6 and/or one or more of the first, second, and third shunt switching elements sh0-sh6 in the transmitter attenuator circuit 202 and/or in the receiver attenuator circuit 204, the amount of attenuation can change in real time. The series switching elements se0-se6 and the first, second, and third shunt switching elements sh0-sh6 in the transmitter attenuator circuit 202 and in the receiver attenuator circuit 204 can be selectively set to the open state or the closed state to obtain a particular attenuation.

Figure 10:
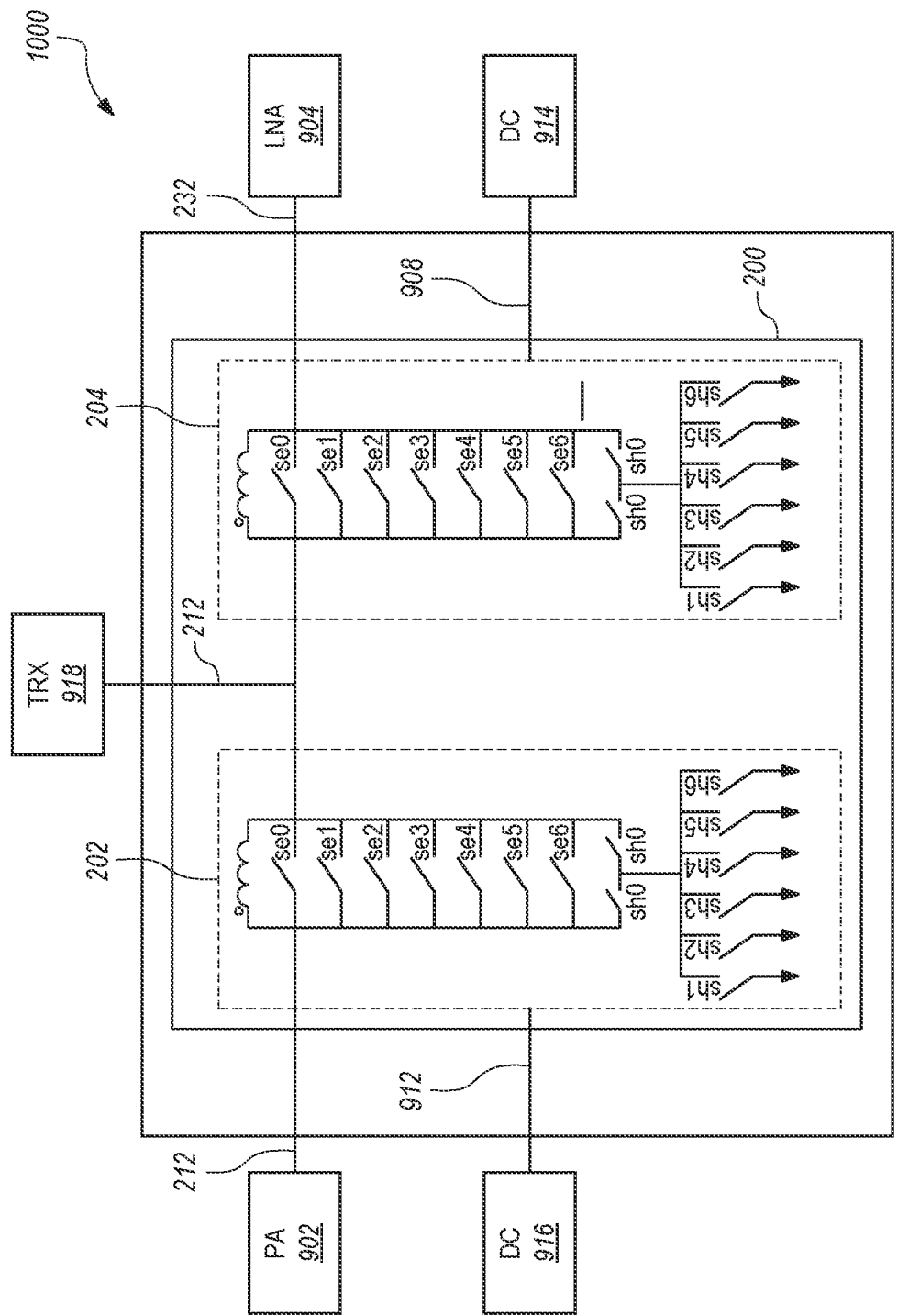
FIG. 10 illustrates a block diagram of a second example system that may include one or more SPDT switches in accordance with embodiments of the disclosure.

FIG. 10 illustrates a block diagram of a second example system 1000 that may include one or more SPDT switches 200 in accordance with embodiments of the disclosure. The system 1000 includes the SPDT switch 200 shown in FIG. 2. In other embodiments, the system 1000 may include the SPDT switch 300 shown in FIG. 3.

The system 1000 is similar to the system 900 shown in FIG. 9 except for the omission of the first decoder circuit 906 and the second decoder circuit 910. In the system of FIG. 10, the control signal line 908 connects to the first digital circuitry 914 and the control signal line 912 connects to the second digital circuitry 916. Thus, the multiple control signal lines that connect to each series switching element se0-se6 and each first, second, and third shunt switching elements sh0-sh6 in the receiver attenuator circuit 204 connect to the first digital circuitry 914. Similarly, the multiple control signal lines that connect to each series switching element se0-se6 and each first, second, and third shunt switching elements sh0-sh6 in the transmitter attenuator circuit 202 connect to the second digital circuitry 916.

Figure 11:
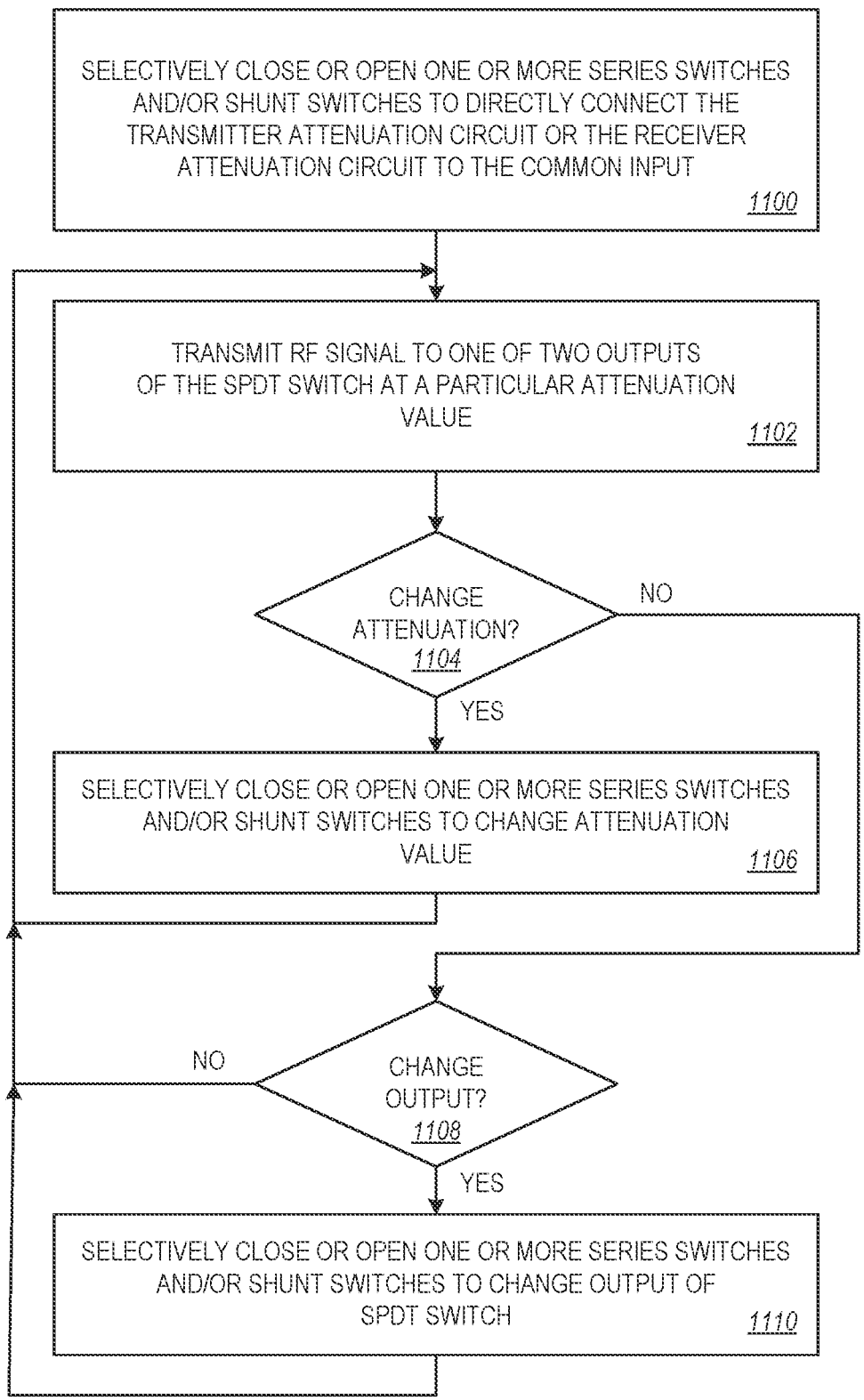
FIG. 11 illustrates a flowchart of a method of operating an SPDT switch in accordance with embodiments of the invention.

FIG. 11 illustrates a flowchart of a method of operating an SPDT switch in accordance with embodiments of the invention. Initially, as shown in block 1100, the series switching elements and the first, second, and third shunt switching elements in the transmitter attenuator circuit and in the receiver attenuator circuit are selectively set to an open state or a closed state in order to directly connect the transmitter attenuator circuit or the receiver attenuator circuit to the common input of the SPDT switch. The setting of the states of the series switching elements and the first, second, and third shunt switching elements provides a given attenuation value as well. An RF signal transmits to one of the outputs of the SPDT switch with the particular attenuation (block 1102). The RF signal transmits to the transmitter signal line (e.g., the transmitter signal line 212 in FIGS. 9 and 10) that may be connected to an amplifier (e.g., a power amplifier) or the RF signal transmits to the receiver signal line (e.g., the receiver signal line 232 in FIGS. 9 and 10) that can be connected to an LNA.

Next, as shown in block 1104, a determination is made as to whether the attenuation value of the transmitter attenuator circuit or the receiver attenuator circuit is to change. If a determination is made that the attenuation value is to change, the method passes to block 1106 where one or more series switching elements and/or one or more of the first, second, and third shunt switching elements in the transmitter attenuator circuit or in the receiver attenuator circuit are selectively set to an open state or a closed state in order to change the attenuation value. The method then returns to block 1102.

When a determination is made at block 1104 that the attenuation remains the same (e.g., not change), the method continues at block 1108 where a determination is made as to whether the output of the SPDT switch is to change. If a determination is made that the output is to change, the method passes to block 1110 where one or more series switching elements and/or one or more of the first, second, and third shunt switching elements in the transmitter attenuator circuit or in the receiver attenuator circuit are selectively set to an open state or a closed state in order to change the output of the SPDT switch. The method then returns to block 1102. When a determination is made at block 1108 that the output is remain the same (e.g., not change), the method returns at block 1102.

Figure 12:
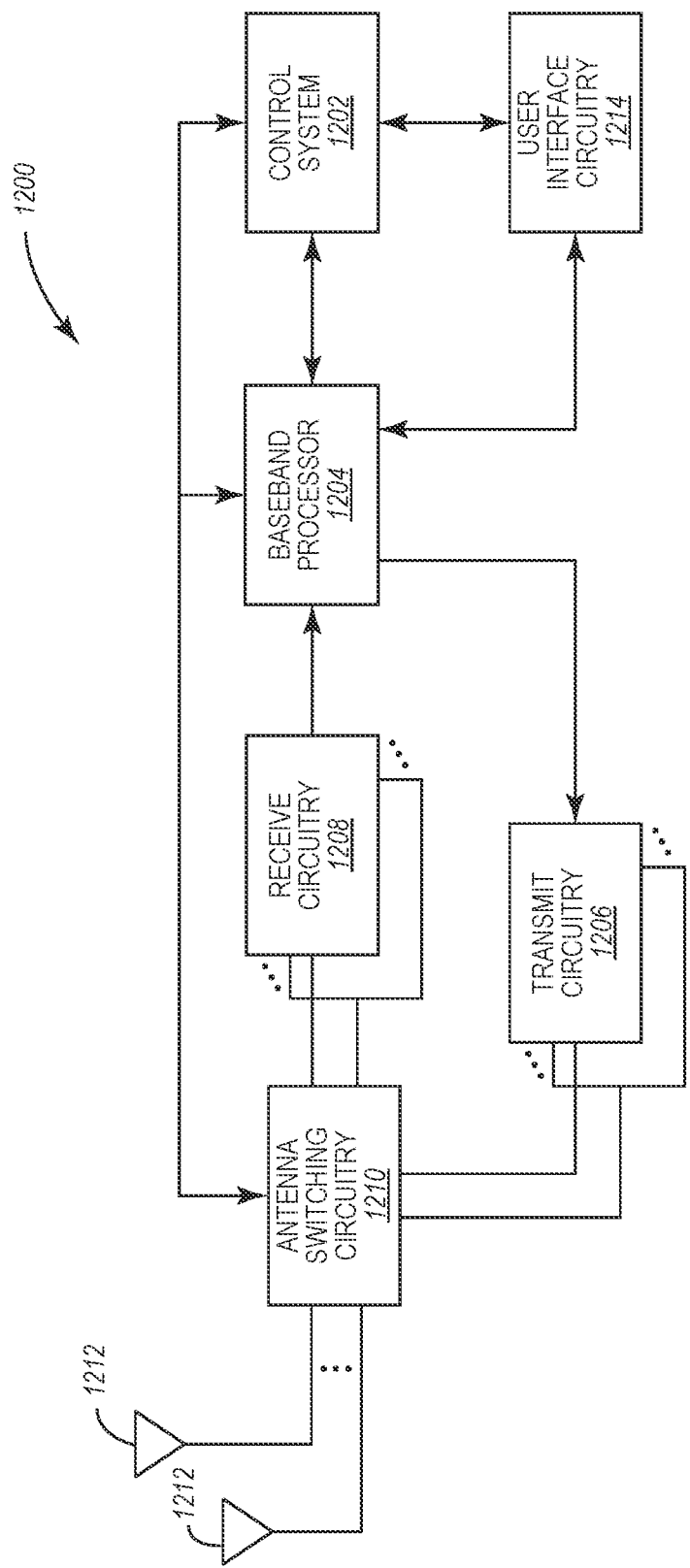
FIG. 12 illustrates a block diagram of example user elements that may include one or more of the SPDT switches shown in FIG. 2 or in FIG. 3 in accordance with the embodiments of the disclosure.

FIG. 12 illustrates a block diagram of example user elements 1200 that may include one or more SPDT switches 200, 300 shown in FIGS. 2 and 3 in accordance with the embodiments. The concepts described above may be implemented in various types of user elements 1200, such as mobile terminals, smart watches, tablets, computers, navigation devices, access points, and like wireless communication devices that support wireless communications, such as cellular, wireless local area network (WLAN), BLUETOOTH, and near field communications. The user elements 1200 will generally include a control system 1202, a baseband processor 1204, transmit circuitry 1206, receive circuitry 1208, antenna switching circuitry 1210, multiple antennas 1212, and user interface circuitry 1214. In a non-limiting example, the control system 1202 can be a field-programmable gate array (FPGA) or an application-specific integrated circuit (ASIC), as an example. In this regard, the control system 1202 can include at least a microprocessor(s), an embedded memory circuit(s), and a communication bus interface(s). The receive circuitry 1208 receives radio frequency signals via the multiple antennas 1212 and through the antenna switching circuitry 1210 from one or more base stations. A low noise amplifier and a filter of the receive circuitry 1208 cooperate to amplify and remove broadband interference from the received signal for processing. Down conversion and digitization circuitry (not shown) will then down convert the filtered, received signal to an intermediate or baseband frequency signal, which is then digitized into one or more digital streams using analog-to-digital converter(s) (ADC).

The baseband processor 1204 processes the digitized received signal to extract the information or data bits conveyed in the received signal. This processing typically comprises demodulation, decoding, and error correction operations, as will be discussed in greater detail below. The baseband processor 1204 is generally implemented in one or more digital signal processors (DSPs) and application specific integrated circuits (ASICs).

For transmission, the baseband processor 1204 receives digitized data, which may represent voice, data, or control information, from the control system 1202, which it encodes for transmission. The encoded data is output to the transmit circuitry 1206, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission and deliver the modulated carrier signal to the multiple antennas 1212 through the antenna switching circuitry 1210 to the multiple antennas 1212. The multiple antennas 1212 and the replicated transmit and receive circuitries 1206, 1208 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A single pole double throw (SPDT) switch, comprising:
a transmitter attenuator circuit directly connected to a common input of the SPDT switch, the transmitter attenuator circuit comprising:
an inductor connected between a first node and a second node;
a first plurality of series switching elements connected in parallel between the first node and the second node, each of the series switching elements being a different field effect transistor;
a second plurality of shunt switching elements connected in parallel between a third node and a reference node, the third node connected between the first node and the second node;
a plurality of gate resistors, each of the gate resistors being connected to a gate of a different one of the series switching elements;
wherein a resistive value of at least some of the gate resistors are different such that the transmitter attenuator circuit is configured to provide a first maximum attenuation, a first minimum attenuation, and at least one first intermediate attenuation having an attenuation between the first maximum attenuation and the first minimum attenuation, wherein first widths of at least some of the first plurality of series switching elements and second widths of at least some of the second plurality of shunt switching elements are selected to determine a first attenuation difference between the first minimum attenuation and the at least one first intermediate attenuation and to determine a second attenuation difference between the at least one first intermediate attenuation and the first maximum attenuation; and
a receiver attenuator circuit directly connected to the common input of the SPDT switch, wherein the receiver attenuator circuit is configured to provide a second maximum attenuation, a second minimum attenuation, and at least one second intermediate attenuation having an attenuation between the second maximum attenuation and the second minimum attenuation.

2. The SPDT switch of claim 1, wherein:
some but not all of the first plurality of series switching elements each comprise a first series resistor connected in series with the different field effect transistor; and
some but not all of the second plurality of shunt switching elements each comprise a second series resistor connected in series with a transistor.

3. The SPDT switch of claim 1, further comprising:
a first shunt switching element connected between the first node and the third node; and
a second shunt switching element connected between the second node and the third node.

4. The SPDT switch of claim 3, wherein the first shunt switching element comprises a first resistor connected to a first transistor and the second shunt switching element comprises a second resistor connected to a second transistor.

5. The SPDT switch of claim 1, wherein the second plurality of shunt switching elements comprises a second plurality of transistors.

6. The SPDT switch of claim 1, wherein the receiver attenuator circuit comprises:
a second inductor connected between the third node and a fourth node;
a second plurality of series switching elements connected in parallel between the third node and the fourth node; and
a third plurality of shunt switching elements connected in parallel between a fifth node and the reference node, the fifth node being connected between the third node and the fourth node.

7. The SPDT switch of claim 6, further comprising:
some but not all of the second plurality of series switching elements each comprise a first series resistor connected in series with a transistor; and
some but not all of the third plurality of shunt switching elements each comprise a second series resistor connected in series with a transistor.

8. The SPDT switch of claim 6, further comprising:
a first shunt switching element connected between the third node and the fifth node; and
a second shunt switching element connected between the fourth node and the fifth node.

9. The SPDT switch of claim 8, wherein the first shunt switching element comprises a first transistor and the second shunt switching element comprises a second transistor.

10. The SPDT switch of claim 6, wherein the second plurality of series switching elements comprises a first plurality of transistors and the third plurality of shunt switching elements comprises a second plurality of transistors.

11. A system, comprising:
a single pole double throw (SPDT) switch;
a transceiver connected to a common input of the SPDT switch, wherein the SPDT switch comprises:
a transmitter attenuator circuit directly connected to the common input of the SPDT switch, the transmitter attenuator circuit comprising:
  an inductor connected between a first node and a second node;
  a first plurality of series switching elements connected in parallel between the first node and the second node, each of the series switching elements being a different field effect transistor;
  a second plurality of shunt switching elements connected in parallel between a third node and a reference node, the third node connected between the first node and the second node;
  a plurality of gate resistors, each of the gate resistors being connected to a gate of a different one of the series switching elements; and
  wherein a resistive value of at least some the gate resistors are different such that the transmitter attenuator circuit is configured to provide a first maximum attenuation, a first minimum attenuation, and at least one first intermediate attenuation having an attenuation between the first maximum attenuation and the first minimum attenuation, wherein first widths of at least some of the first plurality of series switching elements and second widths of at least some of the second plurality of shunt switching elements are selected to determine a first attenuation difference between the first minimum attenuation and the at least one first intermediate attenuation and to determine a second attenuation difference between the at least one first intermediate attenuation and the first maximum attenuation; and
a receiver attenuator circuit directly connected to the common input of the SPDT switch, wherein the receiver attenuator circuit is configured to provide a second maximum attenuation, a second minimum attenuation, and at least one second intermediate attenuation having an attenuation between the second maximum attenuation and the second minimum attenuation.

12. The system of claim 11, further comprising:
an amplifier connected to the first node of the transmitter attenuator circuit through a transmitter signal line; and
a low noise amplifier connected to the second node of the receiver attenuator circuit through a receiver signal line.

13. The system of claim 10, further comprising:
a first shunt switching element connected between the first node and the third node; and
a second shunt switching element connected between the second node and the third node.

14. The system of claim 11, further comprising a decoder circuit connected to each of the series switching elements and each of the shunt switching elements in the transmitter attenuator circuit through respective control signal lines.

15. The system of claim 11, wherein the receiver attenuator circuit comprises:
a second inductor connected between the third node and a fourth node;
a second plurality of series switching elements connected in parallel between the third node and the fourth node; and
a third plurality of shunt switching elements connected in parallel between a fifth node and the reference node, the fifth node being connected between the third node and the fourth node.

16. The system of claim 15, further comprising:
a first shunt switching element connected between the third node and the fifth node; and
a second shunt switching element connected between the fourth node and the fifth node.

17. The system of claim 16, further comprising a decoder circuit connected to each of the series switching elements and each of the shunt switching elements in the receiver attenuator circuit through respective control signal lines.

18. A method of operating a single pole double throw (SPDT) switch, the method comprising:
selectively opening and closing at least one of one or more series switches, in a transmitter attenuator circuit, the transmitter attenuator circuit comprising:
  an inductor connected between a first node and a second node;
  a first plurality of series switching elements connected in parallel between the first node and the second node, each of the series switching elements being a different field effect transistor;
  a second plurality of shunt switching elements connected in parallel between a third node and a reference node, the third node connected between the first node and the second node; and
  a plurality of gate resistors, each of the gate resistors being connected to a gate of a different one of the series switching elements; and
selectively opening and closing at least one of the one or more series switches, or one or more shunt switching elements, in a receiver attenuator circuit, wherein:
  the selectively opening and closing in the transmitter attenuator circuit and in the receiver attenuator circuit directly connects the transmitter attenuator circuit to a common input of the SPDT switch; and
  wherein a resistive value of at least some of the gate resistors are different such that the selective opening and closing in the transmitter attenuator circuit produces a particular attenuation value for the transmitter attenuator circuit, wherein the particular attenuation value is an attenuation between a minimum and a maximum attenuation of the transmitter attenuator circuit, wherein first widths of at least some of the first plurality of series switching elements and second widths of at least some of the second plurality of shunt switching elements are selected to determine a first attenuation difference between a first minimum attenuation and a first intermediate attenuation and to determine a second attenuation difference between the first intermediate attenuation and a first maximum attenuation.

19. A method of operating a single pole double throw (SPDT) switch, the method comprising:
selectively opening and closing at least one of one or more series switches, or one or more shunt switching elements, in a transmitter attenuator circuit; and
selectively opening and closing at least one of the one or more series switches in a receiver attenuator circuit, the receiver attenuator circuit comprising:
  an inductor connected between a first node and a second node;

a first plurality of series switching elements connected in parallel between the first node and the second node, each of the series switching elements being a different field effect transistor;

a second plurality of shunt switching elements connected in parallel between a third node and a reference node, the third node connected between the first node and the second node; and a plurality of gate resistors, each of the gate resistors being connected to a gate of a different one of the series switching elements, wherein:

the selectively opening and closing in the transmitter attenuator circuit and in the receiver attenuator circuit directly connects the receiver attenuator circuit to a common input of the SPDT switch; and wherein a resistive value of at least some the gate resistors are different such that the selective opening and closing in the receiver attenuator circuit produces a particular attenuation value for the receiver attenuator circuit, wherein the particular attenuation value is an attenuation between a minimum and a maximum attenuation of the receiver attenuator circuit, wherein first widths of at least some of the first plurality of series switching elements and second widths of at least some of the second plurality of shunts switching elements are selected to determine a first attenuation difference between a first minimum attenuation and a first intermediate attenuation and to determine a second attenuation difference between the first intermediate attenuation and a first maximum attenuation.

* * * * *